United States Patent [19]
Priem et al.

[11] Patent Number: 5,504,855
[45] Date of Patent: Apr. 2, 1996

[54] METHOD AND APPARATUS FOR PROVIDING FAST MULTI-COLOR STORAGE IN A FRAME BUFFER

[75] Inventors: Curtis Priem, Fremont; Chris Malachowsky, Santa Clara; Rick Silverman, Cupertino; Shuen C. Chang, San Jose, all of Calif.

[73] Assignees: Sun Microsystems, Inc., Mountain View; Samsung Semiconductors, San Jose, both of Calif.

[21] Appl. No.: 145,756

[22] Filed: Oct. 29, 1993

(Under 37 CFR 1.47)

[51] Int. Cl.⁶ .................................................. G06F 15/00
[52] U.S. Cl. .......................................... 395/162; 395/164
[58] Field of Search ...................................... 395/162, 166, 395/164; 345/185, 186, 187, 200

[56] References Cited

U.S. PATENT DOCUMENTS 4,648,077   3/1987   Pinkham ................................. 365/240
4,752,893   6/1988   Guttag et al. ........................... 364/518
5,282,177   1/1994   McLaury ............................. 365/230.05
5,319,606   6/1994   Bowen et al. ....................... 365/230.06

*Primary Examiner*—Mark R. Powell
*Assistant Examiner*—U. Chauhan
*Attorney, Agent, or Firm*—Blakely, Sokoloff, Taylor & Zafman

[57] ABSTRACT

A frame buffer for accelerating the display of graphics data on an output display device which frame buffer includes a pair of color value registers each of which may be loaded with color values prior to writing to the frame buffer. Selection means are provided for selecting pixel data from the bus, from a first of the color value registers, from the second of the color value registers, or from both color value registers simultaneously. When data is written to the frame buffer from color value registers it may be written to a number of pixel positions simultaneously.

19 Claims, 7 Drawing Sheets

METHOD AND APPARATUS FOR PROVIDING FAST MULTI-COLOR STORAGE IN A FRAME BUFFER

BACKGROUND OF THE INVENTION

1. Field of the Invention

This invention relates to computer systems, and more particularly, to methods and apparatus for accelerating the writing of data to storage in a frame buffer memory.

2. History of the Prior Art

One of the significant problems involved in increasing the ability of desktop computers has been in finding ways to increase the rate at which information is transferred to an output display device. Many of the various forms of data presentation which are presently available require that copious amounts of data be transferred. For example, if a computer output display monitor is operating in a color mode in which 1024×780 pixels are displayed on the screen and the mode is one in which thirty-two bits are used to define each pixel, then a total of over twenty-five millions bits of information must be transferred to the screen with each frame that is displayed. Typically, sixty flames are displayed each second so that over one and one-half billion bits must be transferred to the display each second. This requires a very substantial amount of processing power. In general, the transfer of this data to the display slows the overall operation of the computer.

In order to speed the process of transferring data to the display, various accelerating circuitry has been devised. In general, this circuitry is adapted to relieve the central processor of the computer of the need to accomplish many of the functions necessary to transfer data to the display. Essentially, these accelerators take over various operations which the central processor would normally be required to accomplish. For example, block transfers of data from one position on the screen to another require that each line of pixel data being transferred on the screen be read and rewritten to a new line. Storing information within window areas of a display requires that the data available for each window portion be clipped to fit within that window portion and not overwrite other portions of the display. Many other functions require the generation of various vectors when an image within a window on the display is cleared or somehow moved. When accomplished by a central processing unit, all of these operations require a substantial portion of the time available to the central processing unit. These repetitive sorts of functions may be accomplished by a graphics accelerator and relieve the central processor of the burden. In general, it has been found that if operations which handle a great number of pixels at once are mechanized by a graphics accelerator, then the greatest increase in display speed may be attained.

The typical frame buffer is written in a mode referred to hereinafter as normal mode. In normal mode, each pixel position in the frame buffer is separately addressed and accessed; and the pixel data is sent on the data bus to these addressed positions. For example, with a thirty-two conductor data bus, thirty-two bits defining a pixel may be placed on the bus and sent to positions in the frame buffer memory. If the computer is functioning in a thirty-two bit color mode, this data defines a single pixel; in sixteen bit color mode, two pixels; in eight bit color mode, four pixels.

If a frame buffer is addressed a pixel (or two, or four) at a time, then each pixel in the frame buffer may be described by an different individual color; however, this normal mode of operation is very slow.

When text is being written into a document and to the screen by a user, individual pixels are being affected by the manipulation of the keys so the speed at which the pixel information is placed in the frame buffer is not limiting. However, there are many manipulations accomplished by graphical rendering devices in which the need to describe each pixel separately using the normal mode of writing makes the operation very slow. For example, when a text file is first opened in a window on the display, the writing of individual pixels makes the operation very slow. Similarly, when text is scrolled, writing individual pixels makes the operation very slow.

For this reason, a color block mode of writing has been devised for frame buffers. In this color block mode, the data transferred on the data bus indicates, not pixel values, but control signals signifying whether a pixel is to be written or not. A color register which is a part of the frame buffer stores a color value which is written to the pixel position if the pixel position is enabled by the control signal. Nothing is written to a pixel position which is not enabled. This color block mode of operation allows simultaneous writes of the single color stored in the color register to a number of pixel positions equal to the number of conductors on the data bus.

Using this color block mode of operation with a color value register speeds up writing to a frame buffer under many of the conditions in which lack of speed is most obvious. Unfortunately, this mode of operation has a number of limitations. For example, typical operations which are accomplished with the data in any window of the display involve a manipulation of only two colors. For example, when text is written to the screen, the color of each letter and the color of the background surrounding that letter are manipulated by varying the pixels stored in the frame buffer for describing the image on the display. Unless both colors are written, no outline is provided for the text. Both the software which provides data for display and the various graphical rendering devices which accelerate the manipulation of that data are capable of manipulating two colors at once and usually do so. However, the frame buffers which are available for desktop computers are capable of varying no more than a single color at a time in the color block mode in which a number of pixels may be addressed simultaneously. Thus, though the modern rendering devices speed up the manipulation of data, the presentation slows at the frame buffer which is able to accept only a single color at a time when presented data in the block mode of operation. This problem is especially acute because each time a different color is used for a group of pixels, the color register must be updated from the old color value to the new color value in a time consuming operation before the new color may be used. Thus, a background color must be first placed in the color value register in one operation for a first row on the display. The pixels of that color must be written to the frame buffer. Then, the color must be changed in the register, and those pixels of the foreground color described in a second write operation. When, the next row of pixels is written to the frame buffer, the entire operation must be repeated again. The need to repeat the same operation for each row of the frame buffer greatly slows the speed at which pixel data may be written.

SUMMARY OF THE INVENTION

It is, therefore, an object of the present invention to allow at least two colors to be written to a frame buffer simultaneously.

It is another more specific object of the present invention to provide an improved frame buffer capable of being written with data representing a plurality of colors without the necessity of reloading a color register on the frame buffer.

These and other objects of the present invention are realized in a frame buffer for accelerating the display of graphics data on an output display device which frame buffer includes a pair of color value registers each of which may be loaded with color values prior to writing to the frame buffer. Selection means are provided for selecting pixel data from the bus, from a first of the color value registers, from the second of the color value registers, or from both color value registers simultaneously. When data is written to the frame buffer from color value registers it may be written to a number of pixel positions simultaneously.

These and other objects and features of the invention will be better understood by reference to the detailed description which follows taken together with the drawings in which like elements are referred to by like designations throughout the several views.

NOTATION AND NOMENCLATURE

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to a method and apparatus for operating a computer in processing electrical or other (e.g. mechanical, chemical) physical signals to generate other desired physical signals.

DETAILED DESCRIPTION OF THE INVENTION

Figure 1:
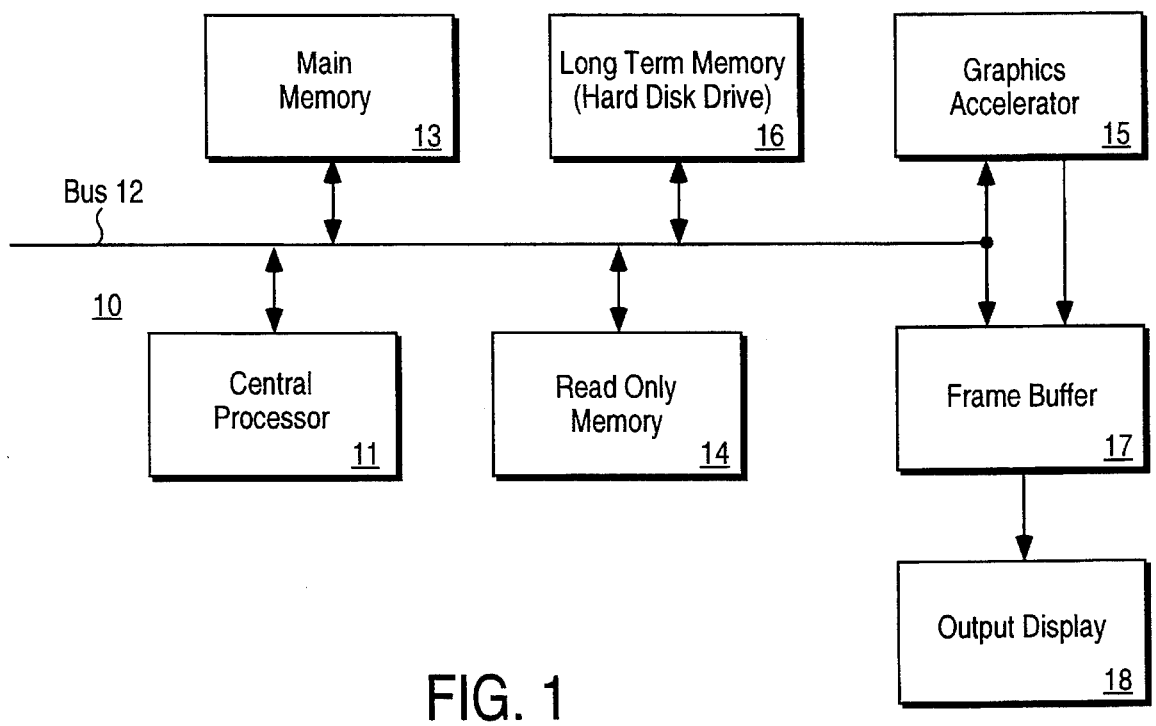
FIG. 1 is a block diagram illustrating a computer system which may include the present invention.

Referring now to FIG. 1, there is illustrated a computer system 10. The system 10 includes a central processor 11 which carries out the various instructions provided to the computer 10 for its operations. The central processor 11 is joined to a bus 12 adapted to carry information to various components of the system 10. For the purpose of this description, the bus 12 may be considered to represent both a data bus and an address bus. Also connected to the bus 12 is main memory 13 which is typically constructed of dynamic random access memory arranged in a manner well known to those skilled in the prior art to store information being used by the central processor during the period in which power is provided to the system 10. A read only memory 14 which may include various memory devices (such as electrically programmable read only memory devices (EPROM devices)) well known to those skilled in the art which are adapted to retain a memory condition in the absence of power to the system 10 is also connected to provide information on the bus 12. The read only memory 14 typically stores various basic functions used by the processor 11 such as basic input/output and startup processes.

Also connected to the bus 12 are various peripheral components such as long term memory 16. The construction and operation of long term memory 16 (typically electromechanical hard disk drives) are well known to those skilled in the art. A frae buffer 17 is also coupled to the bus 12. The frame buffer 17 stores data which is to be transferred to an output device such as a monitor 18 to define pixel positions on the output device. For the purposes of the present explanation, the frame buffer 17 may be considered to include in addition to various planes of memory cells necessary to store information, various circuitry well known to those skilled in the art such as addressing circuitry, sensing amplifiers, color lookup tables (where color indexing is utilized), digital-to-analog converter circuitry, and circuitry for controlling the scan of information to the output display. In FIG. 1, the frame buffer 17 is illustrated as coupled to the bus 12 through circuitry such as graphic accelerating circuit 15 used for providing fast rendering of graphical data to be furnished to the frame buffer 17. The graphic accelerating circuit 15 typically relieves the central processor of a number of time consuming operations so that the computer system may operate more rapidly.

Figure 2:
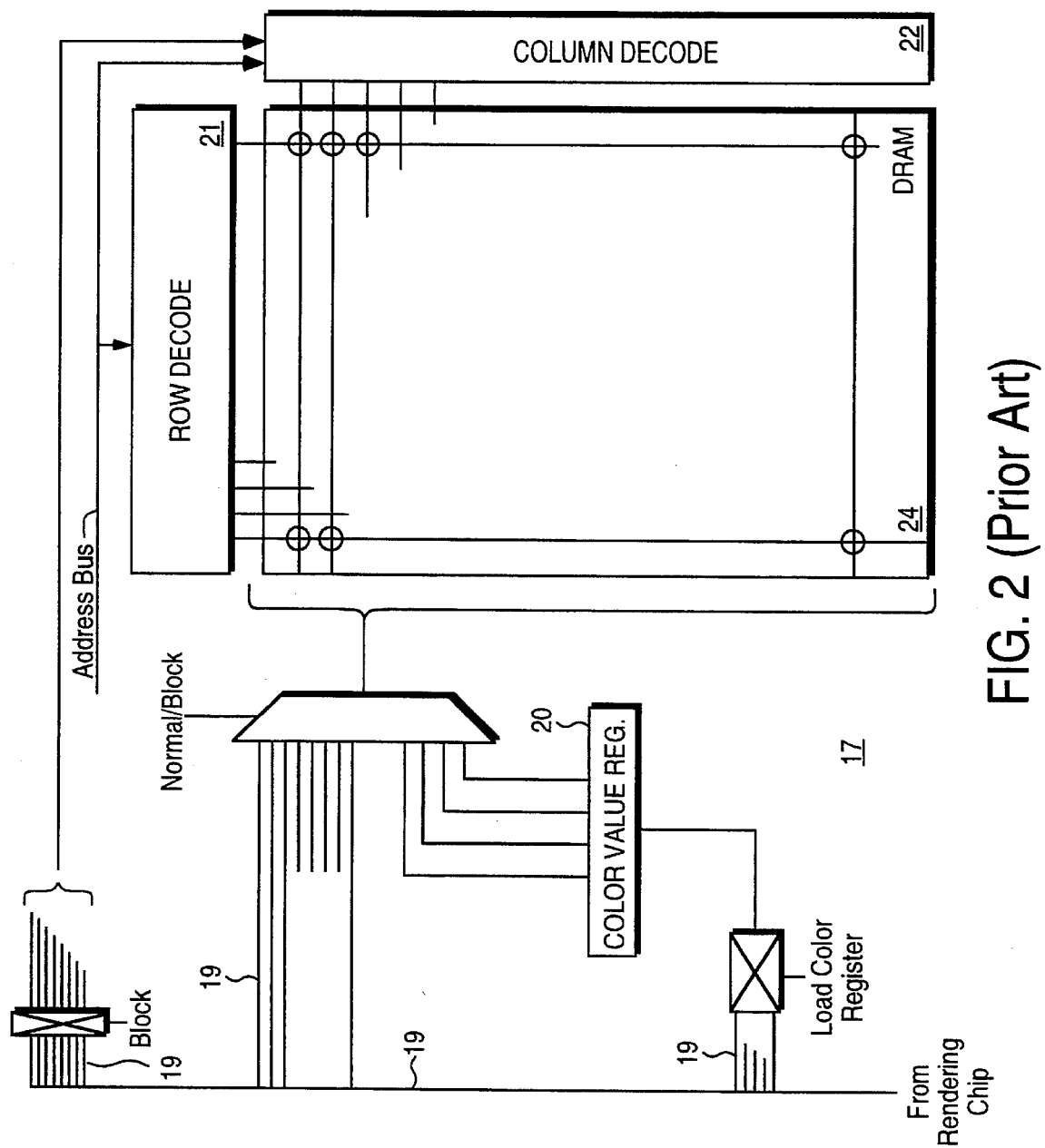
FIG. 2 is a block diagram illustrating a frame buffer constructed in accordance with the prior art.

FIG. 2 illustrates a frame buffer 17 constructed in accordance with the prior art. Typically such a frame buffer includes a dynamic random access memory array 24 designed to store the information defining pixels on the output display. As outlined above, when a random access memory used as a frae buffer 17 is accessed in its normal mode of operation, data is written to or read from the frame buffer 17 on the conductors of a data bus 19. When the frame buffer 17 is written, all of the data conductors transfer data in a binary pattern. In a typical computer system having a thirty-two bit data bus 19, thirty-two bits of information may be written to the frame buffer memory and appear at thirty-two input pins. This data may define one or more pixels depending upon the number of bits required to define a pixel in the particular color mode of operation. For example, if the mode of operation is eight bit color, then each pixel displayed requires eight bits of data; and thirty-two bits of data on the data conductors are capable of defining four pixels in each write access. This is a relatively slow method of filling the frame buffer with pixel data to be written to the display. This is, however, the typical method (normal mode) of writing to a frame buffer.

It is used for most user entries of data where the speed of writing to the frame buffer is not limiting. It is also used in other instances where a window contains more than two different colors for manipulating large numbers of pixels, such as when a paint file containing a multicolored image is first opened or is moved on the display.

There are many operations which affect the display, however, which manipulate very large numbers of pixels and do not require that pixels be individually written with different color values. These operations include, for example, clearing the entire display or a window of the display, writing a file to a window, and similar operations. Because filling the frame buffer (or a portion thereof) is so slow when each pixel (or two, or four) is individually written to the frame buffer using the data conductors as in the normal mode of writing, some frame buffers also have circuitry which allows a mode of operation (referred to as "color block mode") in which each of the data conductors controls access to all of the bits representing a single size of pixel. This color block mode has been used in the prior art with frae buffer arrays in which each pixel is typically represented by four bits allowing sixteen different colors to be described. The mode allows a single color value stored in a register to be written to a plurality of individual pixel positions in the frame buffer memory simultaneously. In this block write mode, the information written to the array on the data conductors is used to enable writing to the memory positions representing particular pixel positions. The color value is stored in a color value register on the frame buffer and written to the enabled positions. This allows a number of pixels up to the number of data conductors on the data bus to be written with a single color simultaneously.

FIG. 2 shows a frame buffer 17, a data bus 19 having a plurality of data input conductors, and a color register 20. A four bit color value to be stored as pixel data in memory cells in the memory array 24 is written into the color register 20 on the conductors of the data bus 19. An address furnished on an address bus to row decode circuitry 21 and column decode circuitry 22 selects the particular group of pixels to be written. In the block write mode, data transferred to the frame buffer 17 on the data conductors of the data bus 19 indicates the positions of pixels which are to be written. These control signals on the data conductors are transferred to the column decode circuitry 22 to enable the selected ones of the addressed pixel positions. If a particular data conductor of the data bus 19 carries a zero value, then the particular pixel position is not written. If a data conductor of the data bus 19 carries a one value, then the four bit color value from the color register 20 is written into the pixel position. In this way, selected ones of a number of individual pixels may be written at once using the color value stored in the color value register 20. This is a very useful manipulation if it is desired to accomplish manipulation of large areas using the same color. For example, with a thirty-two bit data bus, one may rapidly clear a window by writing a background color to the entire window of a display in accesses of thirty-two pixels at a time. This mode also allows pixel data to be clipped to fit within a window. This may be accomplished by enabling pixel position for writing a color within the window while disabling pixel positions outside the window.

A major problem with this color block mode of operation is that the frame buffer is only capable of dealing with one color at a time although more than one pixel may be written simultaneously with that one color. As pointed out, a window uses two colors to display any typical application. The graphical accelerating devices and software which furnish pixel information to the frame buffer 17 typically manipulate two colors at once in order to enhance the speed of operation of the display. Although the color block mode of operation was devised specifically to increase the speed at which pixel data is written to the display, this mode is capable of affecting only one color at once. Consequently, while an entire screen may be cleared rapidly using this color block mode, more advanced manipulations slow down the system operation. For example, when any information is written to the frame buffer using the color block mode, a first background color is placed in the color value register; and the entire first row of the particular window is then cleared by writing the background color in groups of pixels equal to the bus width. Then the foreground color (typically carrying the information) is placed in the color value register, and the foreground pixels are written to the row in the same manner. Then the background color is again placed in the color register, and the entire second row of the particular window is cleared. The background color is then replaced in the color register with the foreground color, and the foreground pixels are written for the second row. This continues until all of the rows of the window have been written. This is a time consuming operation but faster than individually writing each of the positions representing the pixels as in the normal mode. A major reason why it is so slow is the necessity to constantly reload the color register with the foreground and background colors used in each row of the display.

Figure 3:
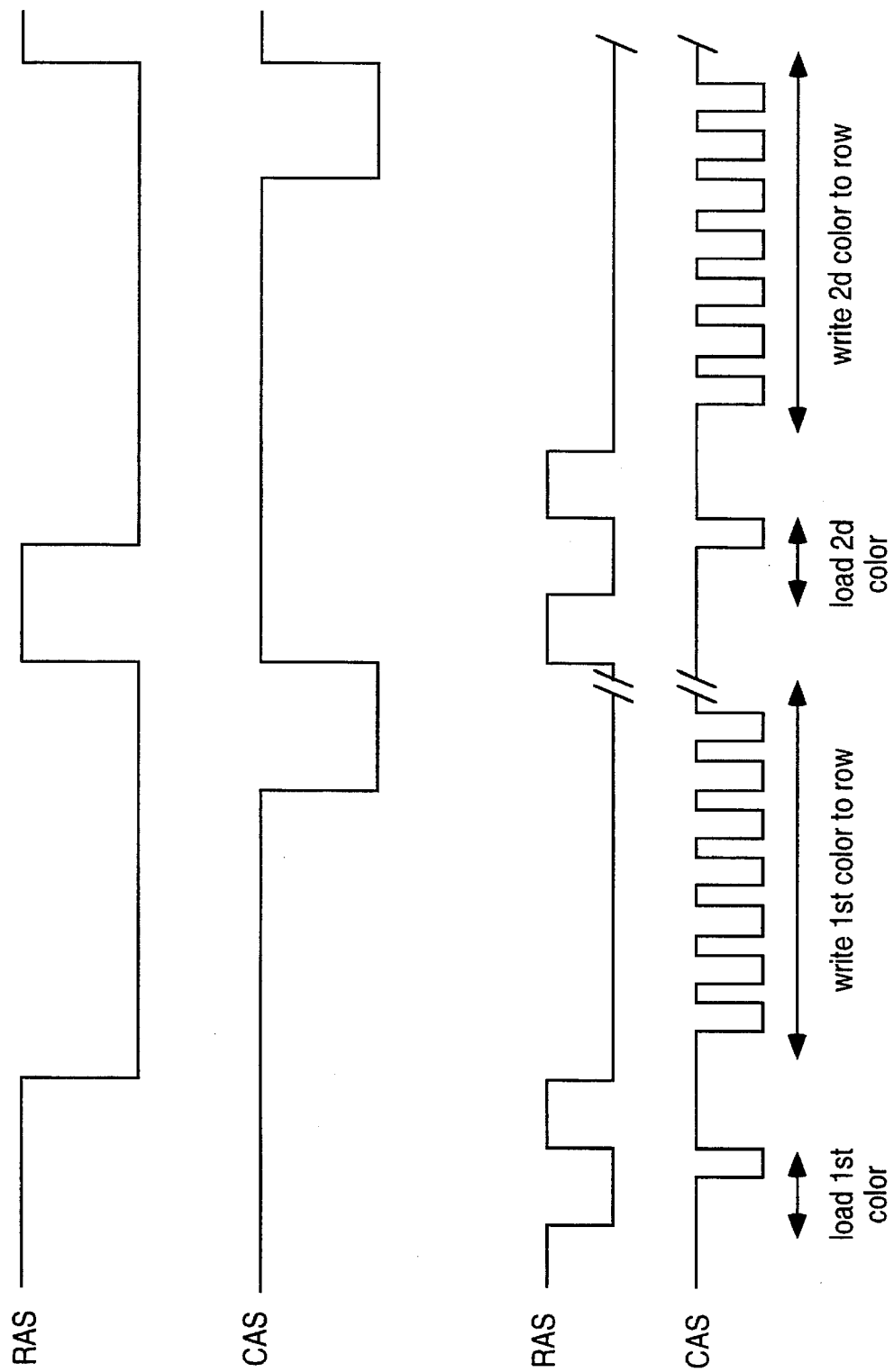
FIG. 3 is a series of timing diagrams useful in understanding the acceleration accomplished by the present invention.

FIG. 3 is a timing diagram illustrating the operation of the prior art frame buffer of FIG. 2. In prior art frame buffers, each access of the frame buffer requires that both a row address strobe (RAS) cycle which typically requires 120 nanoseconds and a column address strobe (CAS) cycle which typically requires 20 nanoseconds be accomplished. These signals are illustrated in the upper two lines of the figure. A first column address strobe cycle may overlap the row address strobe so that the total time for any individual access requiring only a single column address strobe cycle is 120 nanoseconds.

These two cycles are required not only for accessing the memory positions in the frame buffer but also for all other accesses of the frame buffer such as for loading the color value register. Consequently, to write two colors to thirty-two pixel positions using the block write mode requires a number of time consuming steps. The lower two lines of the figure illustrate such steps. To load the color register with background color typically requires a first access of 120 nanoseconds. This must then be followed by a second combined RAS/CAS cycle of 120 nanoseconds when another (write) operation is to be undertaken. Thus, writing the background color stored in the color register requires a minimum RAS/CAS cycle of 120 ns. for the thirty-two pixels. Reloading the color register with foreground color takes another 120 nanoseconds, and writing the foreground color takes another 120 nanoseconds. Thus, the entire operation to write thirty-two pixels requires at least 480 ns. Of course, when an entire row is written, the per pixel time to write using block write mode is shortened because the color value register need only be loaded twice for each row and each group of thirty-two pixels of the same color in the same row requires only 20 additional nanoseconds to write. Since writing a row requires only 20 additional nanoseconds for each thirty-two pixels written with each color, approximately 1240 ns. more time is required to write a row of 1024 pixels once the color has been loaded.

The time necessary to reload the color register twice on each row and the requirement to write twice to each thirty-two-bit position in each row slow the operation significantly. For example, writing thirty-two eight bit pixels in normal mode requires 120 ns for each four pixels which are written or a total of 960 ns. Thus, the color block mode operation to write thirty-two four bit pixels is only slightly faster than writing thirty-two individual four bit pixels in normal mode, 30 ns./pixel. Writing an entire row in normal mode is much slower since each pixel still requires the same 30 ns.

The present invention provides an improved frame buffer memory which provides at least two separate color value registers. The invention is capable of writing two colors simultaneously during accesses involving data representing a plurality of pixels. Because two colors registers are available, the present invention eliminates the need to reload the color value registers twice during the writing of each row of a window. In fact, the invention eliminates any real need to rewrite those color value registers during the time a window is being written since both foreground and background colors are constantly available. The present invention also allows rows of text to be written and other manipulations to be accomplished in single write accesses using the color block mode of operation. By having more than one color available, two colors may be written simultaneously so that individual accesses to write foreground and background colors in a row are not necessary in non-clipped regions of a window. When writing to clipped regions of a window, two accesses are still required but the loading of color registers required by the prior art to accomplish the writing of two colors is eliminated. The use of at least two color registers significantly increases the speed at which large blocks of pixel data may be loaded into a frame buffer. By adding even more color registers, the need to rewrite those registers during display operations may be almost completely eliminated.

Figure 4:
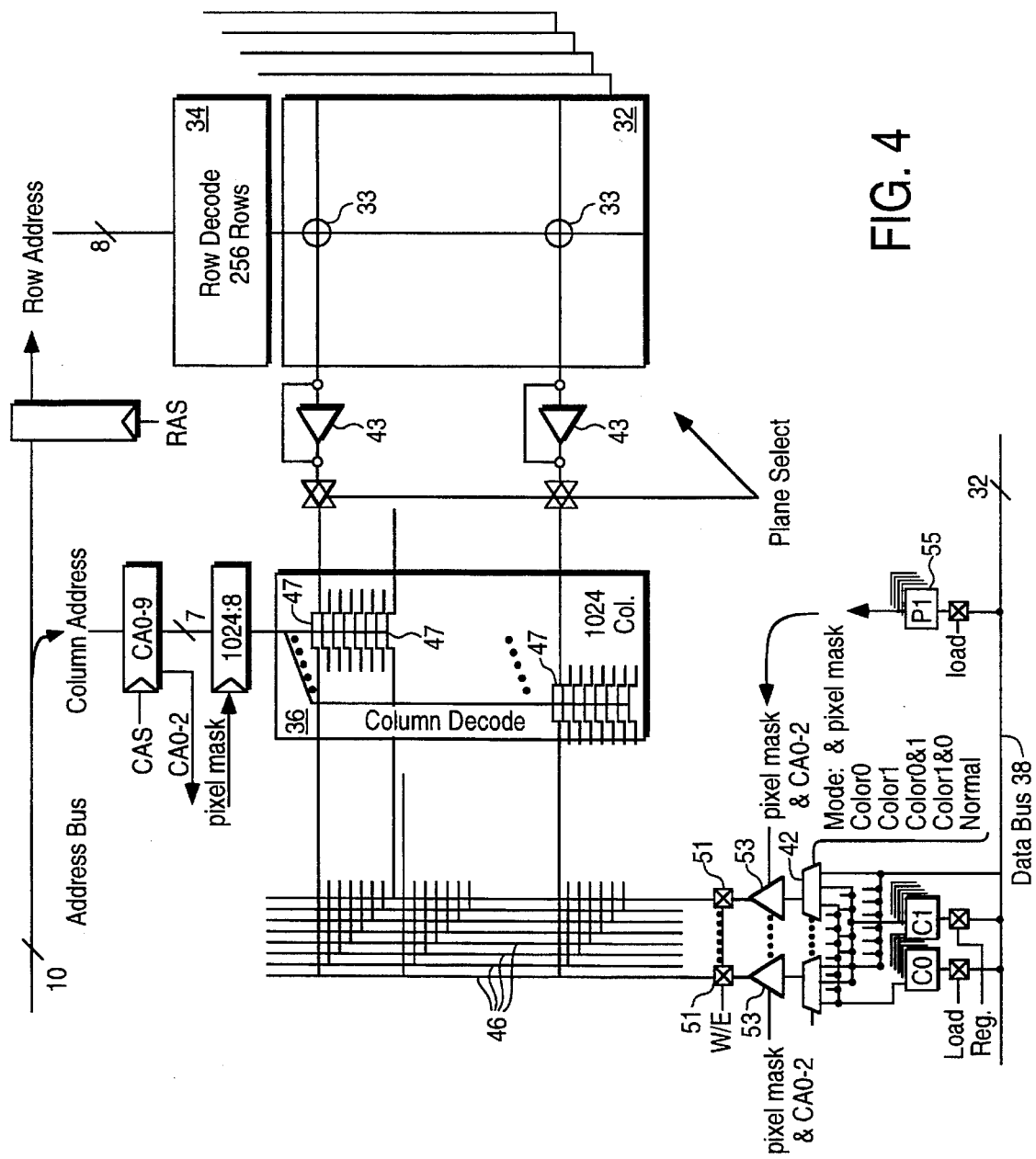
FIG. 4 is a more detailed block diagram of a frame buffer circuit designed to implement the present invention.

Referring now to FIG. 4, there is illustrated a diagram useful in understanding the invention. FIG. 4 illustrates a circuit board upon which reside the various components of a frame buffer 30. The frame buffer 30 includes a plurality of memory cells which may include devices such as field effect transistor devices arranged to provide dynamic random access memory array 32. The arrangement of the cells constituting the array 32 is developed in accordance with principals well known to those skilled in the art. It is adapted to provide a sufficient number of addressable memory cells to describe the number of pixels to be presented on an output display device in a particular mode of operation. For example, such an array 32 might include thirty-two planes (only the first is illustrated in detail), each plane including 256 rows, each row including 1024 memory cells; such an arrangement would allow the storage of color data sufficient to display thirty-two bit color in a 512×512 mode on a color output display terminal.

In addition to the array 32, the frame buffer 30 includes row and column decode circuitry 34 and 36 for decoding the addresses furnished by a controller such as a central processor and selecting individual cells 33 in each plane of the array 32 to define the various pixels which may be represented on an output display device. Also included as a part of the frame buffer 30 are data conductors 38 which may be a portion of a data bus adapted to provide data to be utilized in the array 32. Typically, thirty-two data conductors 38 are provided although this number will vary with the particular computer system.

When data is written to the frame buffer 30 in the normal mode of operation, each group of thirty-two bits will define one or more color values to be displayed at one or more pixel positions on the output display. Thus, when an output display is displaying data in an eight bit color mode, the thirty-two bits carried by the data conductors 38 may define four pixel positions on the display in normal write mode. On the other hand, when a display is displaying data in a thirty-two bit color mode, the thirty-two bits of the data conductors 38 carry information defining a single pixel position on the display. As may be seen, one of the data conductors 38 of the bus is connected to all of eight multiplexors 42 in each plane of the array so that the data bit carried by that conductor 38 may be placed in the appropriate memory cell of the plane of the array 32. Each of the multiplexors 42 selects the source of the data to be transferred to the array 32 in each plane depending on the mode of operation selected. Thus, if the mode is normal, then the data bit is selected directly from the data conductor 38 for that plane of the array. The bit is transferred to the particular column selected and written to that column and the selected row. Since a bit may be written in each of thirty-two planes of the array, thirty-two bits may be written from the bus conductors 38 (one to each plane) as one thirty-two bit pixel, two sixteen bit pixels, or four eight bit pixels, depending on the mode of color operation.

The embodiment illustrated in FIG. 4 is the preferred embodiment of the invention which is particularly adapted to be used in a system utilizing eight bit color modes As will be seen, the system is adapted to provide certain special modes for eight bit color operations. As will be explained, addition special modes for each of sixteen and thirty-two bit color modes may be provided by simple modifications explained herein. To this end, the system utilizes eight individual multiplexors 42 in each plane of the frame buffer 30 for selecting particular write input data. Each of these multiplexors 42 has its output connected to a tri-state write driver 53 which furnishes an output signal via a switch such as a transmission gate 51 on a conductor connected to every eighth column of the particular plane of the array.

In the normal write mode of operation, a particular address is transferred on the address bus to select a particular row and column. This signal on the address bus at the failing edge of the RAS signal selects a particular row and causes all of the memory cells 33 of that row in each plane of the array selected to be connected to sense amplifiers 43 in each column. This operation causes the sense amplifiers 43 to refresh each memory cell in the selected row. At the falling edge of the CAS signal, the column address applied to the appropriate switch 47 of the column decode circuitry 37 selects the appropriate column in each plane to be written.

In the preferred embodiment of the invention, the column address is ten bits. Of these, the higher valued seven bits of the ten bit column address are used to select a group of eight adjacent columns. The normal mode control signal at each of the multiplexors 42 causes the data signal on the particular conductor 38 associated with that plane to be transferred by each of the eight multiplexors 42. One of the signals produced by the multiplexors 42 is amplified by a single one of the amplifiers 53 and transferred to the addressed memory cell 33. The lower three bits of the column address signal select the particular one of the amplifiers 53 which transfers the data bit to a single one of the columns. Since each of the conductors 38 carries an individual bit for the memory cell at the selected row and column, the pixel value (or values) will be transferred to the appropriate column and row positions in each plane of the array.

Figure 6:
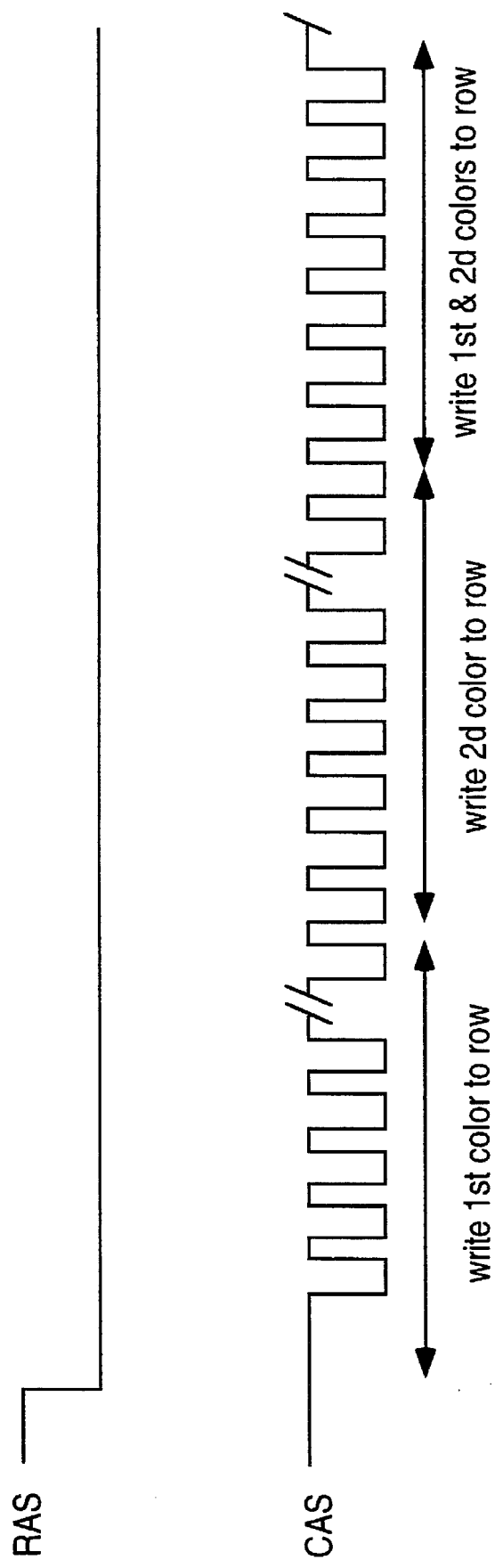
FIG. 6 is a series of timing diagrams illustrating the operation of the present invention.
Figure 7:
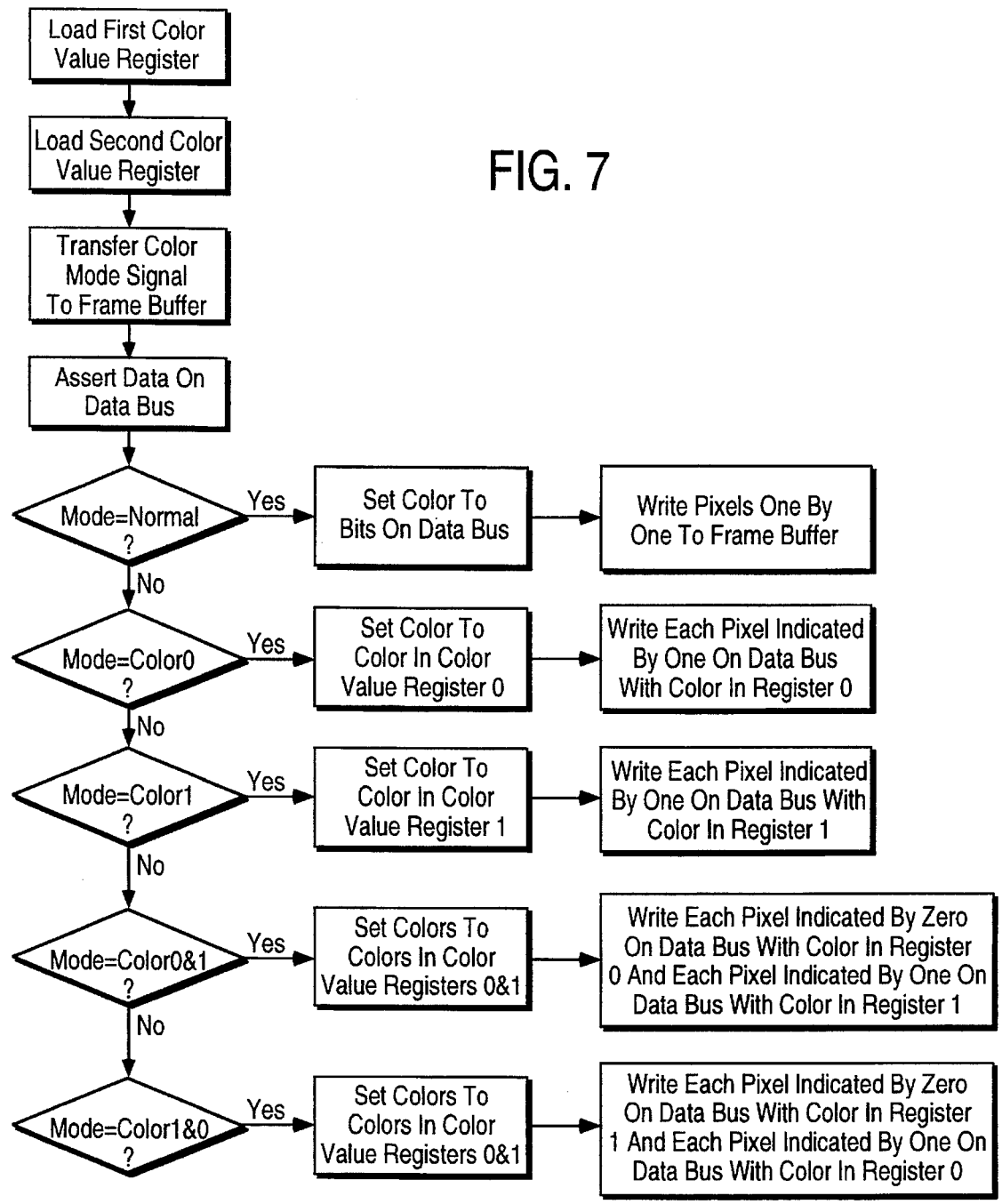
FIG. 7 is a flow chart illustrating a method of practicing the present invention.

When a color block mode of operation is indicated by the control signals, the data conductors 38, rather than carrying pixel data, carry enabling signals to indicate pixel positions in the array 32 to which the color values held in the registers C0 and C1 are to be written. These color values are loaded from the data conductors 38 of each array plane of the frame buffer 30 in response to a load color register (LCR) control signal. Since two color registers C0 and C1 are provided in the preferred embodiment, a total of four color block modes of operation are possible. These modes are referred to as color 0 mode, color 1 mode, color 0 & 1 mode, and color 1 & 0 mode. FIG. 6 is a timing diagram which illustrates the application of the RAS and CAS signals necessary to to write a row of pixels to a frame buffer using any of these color block modes. As will be seen, substantial time is saved with any of these modes of operation simply through the lack of a requirement to load the color value registers for writing to each row of the display. FIG. 7 illustrates the steps of a method in accordance with the present invention. This method is discussed in the description which follows.

In the color 0 mode of operation, if a control signal value of one is transferred on a particular data conductor 38, then the value in the color register C0 is written to the storage positions which define the pixel addressed for that conductor 38. The value in the color register C0 is also transferred to all other storage positions at addresses to which one control values are transferred on the data conductors 38. On the other hand, no color value is written to the pixel positions to which a zero control value is transferred on a data conductor 38. Thus, thirty-two different pixel positions may be affected in a single simultaneous transfer; those positions which receive a one value are enabled to receive the value in the color register C0 while those which receive a zero value remain unchanged.

The manner in which this is accomplished will be illustrated in a case of eight bit color. Presuming that the color value register C0 has been loaded with a pattern of eight bits which is repeated four times in the thirty-two bits provided in that register and that the color value register C1 has been loaded with another pattern of eight bits which is repeated four times in the thirty-two bits provided in that register, then a row and eight columns are selected by the address on the address bus through the row and column address decode circuitry 34 and 36 in the manner described above. Assuming that color block mode 0 is selected, all eight of the multiplexors 42 on each plane select the register C0 as the source of color data for the array. Then the particular write drivers 53 are enabled in accordance with the enabling signals appearing on the conductors 34 of the data bus.

Figure 5:
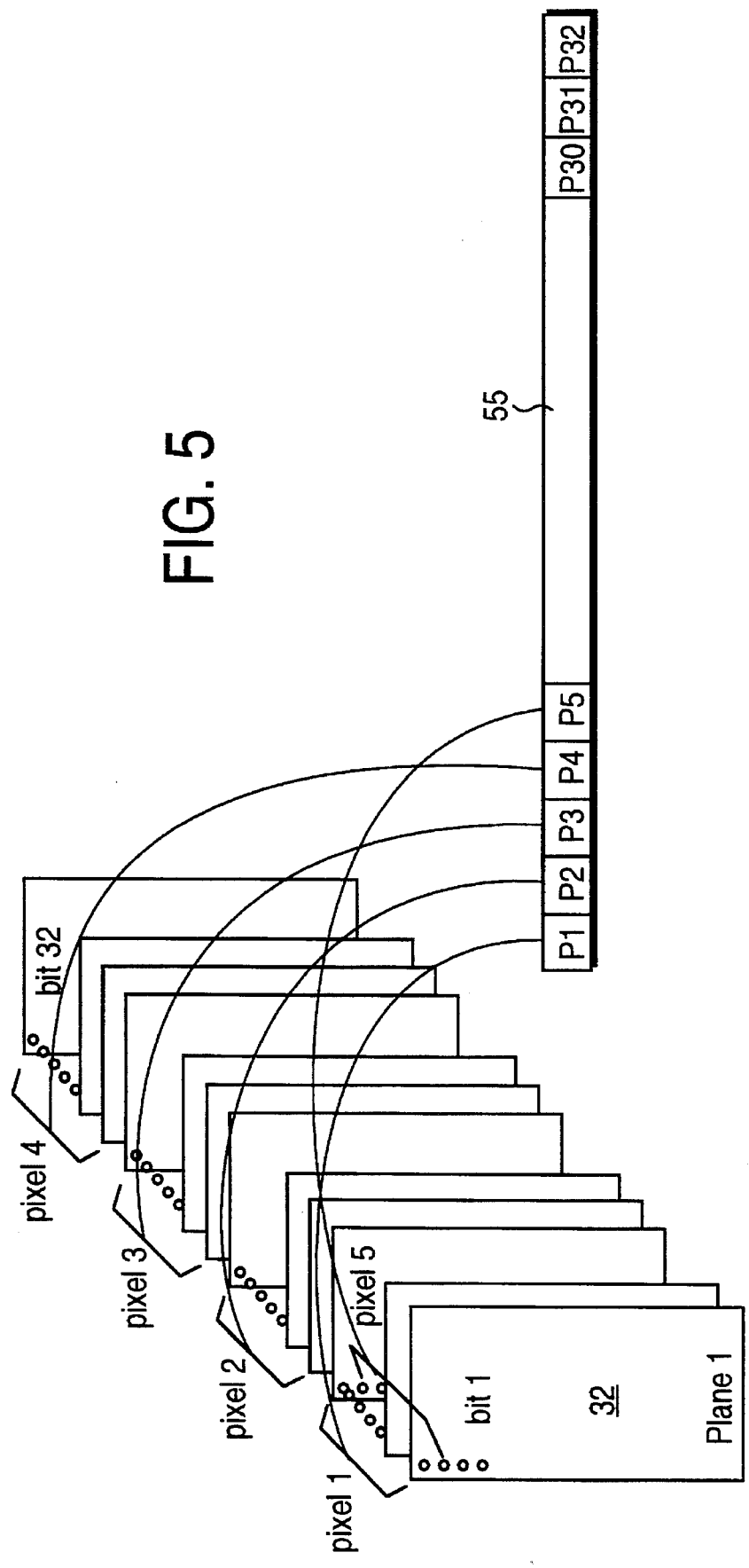
FIG. 5 is a diagram illustrating a portion of the arrangement for selecting pixel positions in the frame buffer circuit of FIG. 4.

The manner in which this is accomplished is illustrated in FIG. 5. The data appearing on the conductors 38 is sent to a pixel mask register 55. The pixel mask register is used to control all of the drivers 53 controlling transfer of data to a particular pixel. Since the example considered involves eight bit color and assuming that the first eight columns have been selected by the column address, the bits defining the first pixel lie in the first column (labeled column 0) in the selected row and the first eight planes of that column. The first pixel P1 in the pixel mask register 55 controls the drivers 53 to transfer the color to these bit positions in the array from the color value register C0. . Presuming that the second one of the conductors 38 carries a zero value and that this value is stored in the pixel mask register 55, the drivers 53 connected to the bit positions lying in the next eight planes of column 0 are disabled so that the value in the color value register C0 is not transferred to these bit positions. The control of the other bit positions occurs in a similar manner as is illustrated in FIG. 5. Consequently, with one row and eight columns selected, a total of thirty-two eight bit color pixels may be written simultaneously with the value stored in the color value register C0. .

This is a fast mode of operation similar to the color block mode used in prior art frame buffers and may be used to clear the screen very rapidly or to otherwise provide a single color to the window area. For example, a frame buffer 30 for a display which is 1024×780 pixels and eight bits deep, may be cleared approximately thirty-two times faster than individual pixels may be written one by one to the frame buffer 30. This mode is also useful for clipping since a color value may be written to pixel positions inside a window area and the pixel positions outside that area ignored.

Color 1 mode is similar to color 0 mode except that if a one value is transferred on a particular data conductor 38, then the value in the color register C1 is written to the storage positions which define the pixel addressed for that conductor 38. The value in the color register C1 is also transferred to all other storage positions at addresses enabled by one values transferred on the data conductors 38. On the other hand, no color value is written to the pixel positions to which a zero is transferred on the data conductors. Again, thirty-two different pixel positions may be affected in a single simultaneous transfer; those positions which receive a one value are enabled to receive the value in the color register C1 while those which receive a zero value remain unchanged. The method of writing the data from the color register C1 is essentially the same as that explained with regard to Color register C0 and will be understood by reviewing FIG. 5.

As may be seen, since the two color registers C0 and C1 may be loaded prior to manipulating any portion of a window and are always available, a series of pixels (e.g., thirty-two) may be written in two accesses without any need to reload color registers. Background color may be written in a first access and foreground color written in a second access. As will be understood, this allows both clipping and two colors to be written to an edge of a window in two accesses since clipped portions may be ignored while a first color is written to some positions within a window area and then the same clipped portions may be ignored again while a second color is written to other positions within the window area.

However, even faster writing is possible using the color modes 0 & 1 and 1 & 0 in those portions of the display in which clipping is unnecessary. As was pointed out above, most operations involved in writing to the display utilize two colors.

Typically, a rendering chip (graphics accelerator) or the central processing unit provides a control signal indicating where clipping is necessary. In the absence of this signal, use of the mode 0 & 1 allows two colors to be written simultaneously to the frame buffer. In this mode a zero value on a data conductor 38 indicates that a color value is to be written to the controlled pixels from the color value register C0 while a one value on a data conductor 38 indicates that a color value is to be written to the controlled pixels from the color value register C1.

This is accomplished by combining the value transferred on the data conductor 34 for each plane and stored in the pixel mask register 55 with the color mode control signal to select the particular color register from which the color value is transferred by the multiplexors 42. For example, when in color mode 0 & 1, a zero in a bit position in the pixel mask register 55 causes a multiplexor 42 to select the color value stored in the color value register C0 while a one in a bit position in the pixel mask register 55 causes a multiplexor 42 to select the color value stored in the color value register C1. Then, the color mode control signals indicating mode 0 & 1 control all of the pixels selected to be written to the array. This allows two separate colors representing both foreground and background to be written simultaneously to those portions of a window area which do not require clipping. In a similar manner, the color 1 & 0 mode allows the two colors in the registers C0 and C1 to be simultaneously written to the array but to opposite positions, a zero now causing the multiplexors 42 to select register C1 while a one causes the selection of register C0. .

In order to make the operation of writing to a frame buffer much faster than in the prior art, the present invention may include an even larger number of additional color value registers. Such registers may be utilized to store additional color values so that a number of different window may be written having different colors without ever having to load a color value register.

The preferred embodiment of the invention has been optimized for the presentation of eight bit color representations on an output display. As is taught in patent application Ser. No. 08/145,335, entitled *FRAME BUFFER SYSTEM DESIGNED FOR WINDOWING OPERATIONS,* Priem et al, filed on even date herewith now abandoned, the embodiment illustrated may be expanded to allow thirty-two sixteen bit pixels or thirty-two thirty-two bit pixels to be written simultaneously, either in one or in two colors by increasing the number of multiplexors 42 and other components connecting to the column select lines to sixteen and thirty-two, respectively. As a concomitant, the number of columns selected by the column decode circuitry would be increased to sixteen and thirty-two, respectively, and various details of the control signals modified to effect the selection of thirty-two having a larger number of bits each. For example, the pixel mask register 55 selectively controls a larger number of bits in each of the different types of color representation. The number of bit positions controlled by each bit in the pixel mask register must also be increased to sixteen for the sixteen bit color mode.

It should also be noted that it is possible to utilize the thirty-two bit write of sixteen bit color without doubling the number of paths from the color value registers to the column select lines by writing to a first group of eight columns of pixels during a falling CAS signal and writing to a second group of eight columns of pixels during a rising CAS signal.

The two or more color value registers used by the present invention thus eliminate the necessity of changing color values in a color register and also eliminate the need to write foreground and background colors to the frame buffer in separate operations for the pixel positions designated on the data conductors. Thus, the accelerated rates acquired by the use of fast rendering chips may be maintained through the frae buffer stage of a computer.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A computer system comprising a central processing unit, main memory, a busing system including a data bus, an output display, and a frame buffer joining the busing system to the output display, the frame buffer comprising an array of memory cells for storing data indicating pixels to be displayed on the output display, access circuitry for selecting memory cells in the array, first and second color value registers, and circuitry for writing color value data from the color value registers to a plurality of storage positions in the array simultaneously.

2. A computer system as claimed in claim 1 in which the circuitry for writing color value data from the color value registers to a plurality of storage positions in the array simultaneously comprises a plurality of multiplexors connected to each of the color registers and to the data bus, and a source of control signals for causing the multiplexors to select color values from the color registers and from the data bus.

3. A computer system as claimed in claim 2 in which the circuitry for causing the multiplexors to select color values from the color registers and from the data bus comprises circuitry for transferring control signals on the data bus.

4. A computer system as claimed in claim 1 in which the circuitry for writing color value data from the color value registers to a plurality of storage positions in the array simultaneously includes circuitry connected for writing from a single color value register to a plurality of storage positions in the array simultaneously.

5. A computer system as claimed in claim 4 in which the circuitry connected for writing from a single color value register to a plurality of storage positions in the array simultaneously comprises a plurality of multiplexors connected to each of the color registers and to the data bus, and circuitry for transferring control signals to cause the multiplexors to select color values from the color registers and from the data bus.

6. A computer system as claimed in claim 1 in which the circuitry for writing color value data from the color value registers to a plurality of storage positions in the array simultaneously includes circuitry connected for writing from both color value registers to a plurality of storage positions in the array simultaneously.

7. A computer system as claimed in claim 6 in which the circuitry for writing from both color value registers to a plurality of storage positions in the array simultaneously comprises a plurality of multiplexors connected to each of the color registers and to the data bus, and circuitry for transferring control signals to cause the multiplexors to select color values from the color registers and from the data bus.

8. A computer system as claimed in claim 1 in which the circuitry for writing color value data from the color value registers to a plurality of storage positions in the array simultaneously includes means for writing from a single color value register to a plurality of storage positions in the array simultaneously, and circuitry for transferring control signals to cause color values to be written from both color value registers to a plurality of storage positions in the array simultaneously.

9. A frame buffer designed to be coupled to a data bus and to an output display in a computer system, the frame buffer comprising an array of memory cells for storing data indicating pixels to be displayed on the output display, access circuitry for selecting memory cells in the array, first and second color value registers, and circuitry for writing color value data from the color value registers to a plurality of storage positions in the array simultaneously.

10. A frame buffer as claimed in claim 9 in which the circuitry for writing color value data from the color value registers to a plurality of storage positions in the array simultaneously comprises a plurality of multiplexors connected to each of the color registers and to the data bus, and a source of control signals for causing the multiplexors to select color values from the color registers and from the data bus.

11. A frame buffer as claimed in claim 10 in which the means for causing the multiplexors to select color values from the color registers and from the data bus comprises circuitry for transferring control signals on the data bus.

12. A frame buffer as claimed in claim 9 in which the circuitry for writing color value data from the color value registers to a plurality of storage positions in the array simultaneously comprises circuitry connected for writing from a single color value register to a plurality of storage positions in the array simultaneously.

13. A frame buffer as claimed in claim 12 in which the circuitry connected for writing from a single color value register to a plurality of storage positions in the array simultaneously comprises a plurality of multiplexors connected to each of the color registers and to the data bus, and circuitry for transferring control signals to cause the multiplexors to select color values from the color registers and from the data bus.

14. A frame buffer as claimed in claim 9 in which the circuitry for writing color value data from the color value registers to a plurality of storage positions in the array simultaneously comprises circuitry connected for writing from both color value registers to a plurality of storage positions in the array simultaneously.

15. A frame buffer as claimed in claim 14 in which the circuitry connected for writing from both color value registers to a plurality of storage positions in the array simultaneously comprises a plurality of multiplexors connected to each of the color registers and to the data bus, and circuitry for transferring control signals to cause the multiplexors to select color values from the color registers and from the data bus.

16. A frame buffer as claimed in claim 9 in which the circuitry for writing color value data from the color value registers to a plurality of storage positions in the array simultaneously comprises means for writing from a single color value register to a plurality of storage positions in the array simultaneously, and means for writing from both color value registers to a plurality of storage positions in the array simultaneously.

17. A method for writing to a frame buffer including an array of memory cells comprising the steps of writing a first color value to a first color value register of the frame buffer, writing a second color value to a second color value register of the frame buffer, and selecting a color value to write to a plurality of memory cells simultaneously.

18. A method for writing to a frame buffer as claimed in claim 17 further comprising the step of selecting another color value to write to a plurality of memory cells simultaneously without the need to reload a color value register.

19. A method for writing to a frame buffer as claimed in claim 17 in which the step of selecting a color value to write to a plurality of memory cells simultaneously comprises selecting two color values to write to different ones of a plurality of memory cells simultaneously.

* * * * *

UNITED STATES PATENT AND TRADEMARK OFFICE
CERTIFICATE OF CORRECTION

PATENT NO. : 5,504,855
DATED : April 2, 1996
INVENTOR(S) : Priem et al.

It is certified that errors appear in the above-identified patent and that said Letters Patent is hereby corrected as shown below:

In column 4 at line 45, please delete " frae " and insert -- frame --.

In column 5 at line 38, please delete " frae " and insert -- frame --.

Signed and Sealed this

Twenty-sixth Day of November 1996

Attest:

BRUCE LEHMAN

Attesting Officer    Commissioner of Patents and Trademarks